(12) United States Patent
Folk et al.

(10) Patent No.: US 8,735,326 B2
(45) Date of Patent: May 27, 2014

(54) METHODS OF FORMING SUPERCONDUCTOR CIRCUITS

(75) Inventors: Erica Folk, Linthicum Heights, MD (US); Patrick B. Shea, Washington, DC (US); Andrew C. Loyd, Monkton, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 675 days.

(21) Appl. No.: 12/783,116

(22) Filed: May 19, 2010

(65) Prior Publication Data

US 2011/0287944 A1   Nov. 24, 2011

(51) Int. Cl.
*H01L 39/24* (2006.01)

(52) U.S. Cl.
USPC ........... 505/410; 505/728; 505/816; 505/817; 427/62

(58) Field of Classification Search
USPC ............... 505/410, 728, 816, 817; 427/62
See application file for complete search history.

(56) References Cited

U.S. PATENT DOCUMENTS

| | | | | |
|---|---|---|---|---|
| 4,835,193 A * | 5/1989 | Hayase et al. | ........... | 522/15 |
| 4,971,948 A * | 11/1990 | Dam et al. | ........... | 505/413 |
| 5,688,383 A * | 11/1997 | Pang | ........... | 204/192.24 |
| 6,274,471 B1 * | 8/2001 | Huang | ........... | 438/597 |
| 6,348,699 B1 * | 2/2002 | Zehe | ........... | 257/32 |
| 2003/0071258 A1 * | 4/2003 | Zagoskin et al. | ........... | 257/31 |
| 2004/0105140 A1 * | 6/2004 | Fujita | ........... | 359/245 |
| 2006/0244177 A1 * | 11/2006 | Kaneto et al. | ........... | 264/248 |

\* cited by examiner

*Primary Examiner* — Paul Wartalowicz
(74) *Attorney, Agent, or Firm* — Tarolli, Sundheim, Covell & Tummino LLP

(57) ABSTRACT

Methods of forming superconducting devices are disclosed. In one embodiment, the method can comprise depositing a protective barrier layer over a superconducting material layer, curing the protective barrier layer, depositing a photoresist material layer over the protective barrier layer and irradiating and developing the photoresist material layer to form an opening pattern in the photoresist material layer. The method can further comprise etching the protective barrier layer to form openings in the protective barrier layer based on the opening pattern, etching the superconductor material layer based on the openings in the protective barrier layer to form openings in the superconductor material layer that define a first set of superconductor material raised portins and stripping the photoresist material layer and the protective barrier layer.

18 Claims, 5 Drawing Sheets

METHODS OF FORMING SUPERCONDUCTOR CIRCUITS

TECHNICAL FIELD

The present invention relates generally to superconductors, and more particularly to methods of forming superconducting circuits.

BACKGROUND

Efforts on fabrication of quantum bits (qubits) have mostly been confined to university or government research labs, with little published on the mass producing qubit circuits. Therefore, many of the methods used to fabricate qubits in these laboratories utilize processes or equipment incapable of rapid, consistent fabrication. For example, most qubit fabrication methods utilize electron beam lithography (EBL). EBL is great for fabricating small feature sizes, but is usually very slow, taking several hours to write a wafer. The tradeoff then becomes using small samples with acceptable production time, or large samples with long production times. Some literature reports on rapid fabrication of superconducting phase qubits, but typically small samples are used that don't exploit the relative economies of scale that make volume semiconductor fabrication so attractive. Small samples can be utilized with quick turn-around time, but in the end many samples need to be fabricated. Therefore, the entire process flow needs to be repeated increasing the likelihood of errors at any step in the process flow.

Superconducting qubits based on Josephson junctions are one of the leading technologies proposed for quantum computing and cryptography applications that are expected to provide significant enhancements to national security applications where communication signal integrity or computing power are needed. However, presently these devices remain laboratory curiosities due to the difficulty in achieving reproducible results. To be able to reliably manufacture superconducting qubits would provide a revolutionary step towards making the ideas of quantum cryptography and computing a reality.

SUMMARY

In one aspect of the invention, a method is provided for forming superconductor circuits. The method can comprise depositing a protective barrier layer over a superconducting material layer, curing the protective barrier layer, depositing a photoresist material layer over the protective barrier layer and irradiating and developing the photoresist material layer to form an opening pattern in the photoresist material layer. The method further comprises etching the protective barrier layer to form openings in the protective barrier layer based on the opening pattern, etching the superconductor material layer based on the openings in the protective barrier layer to form openings in the superconductor material layer that define a first set of superconductor material raised portions and stripping the photoresist material layer and the protective barrier layer.

In another aspect of the invention, a method is provided for forming Josephson junctions. The method comprises depositing a protective barrier layer formed of an organic spin-on material over a superconducting material layer, curing the protective barrier layer at a temperature of about 140° C. to about 150° C. for about 60 to about 120 seconds, depositing a photoresist material layer over the protective barrier layer and irradiating and developing the photoresist material layer to form an opening pattern in the photoresist material layer. The method further comprises etching the protective barrier layer to form openings in the protective barrier layer based on the opening pattern, etching the superconductor material layer based on the openings in the protective barrier layer to form openings in the superconductor material layer that define a first set of superconductor material raised portions for the Josephson junctions and stripping the photoresist material layer and the protective barrier layer.

In yet a further aspect of the invention, a method is provided for forming a Josephson junction. The method comprises depositing a superconductor material layer over an insulator layer and/or insulated substrate, depositing a protective barrier layer over the superconducting material layer, and curing the protective barrier layer. The method further comprises depositing a photoresist material layer over the protective barrier layer, irradiating and developing the photoresist material layer to form an opening pattern in the photoresist material layer, etching the protective barrier layer to form openings in the protective barrier layer based on the opening pattern, etching the superconductor material layer based on the openings in the protective barrier layer to form openings in the superconductor material layer that define a base layer raised portion of the Josephson junction and stripping the photoresist material layer and the protective barrier layer.

DETAILED DESCRIPTION

The present invention is directed to employing a protective barrier layer overlying a superconductor material layer during the fabrication of superconducting circuits and/or devices (e.g., a Josephson junction Phase Quantum Bit). The protective barrier layer protects the superconductor material layer from a photoresist developer during the formation of an etch mask to etch superconductor patterns in the superconductor material layer. In one aspect of the invention, the protective barrier layer is formed of an organic spin-on material that can be cured at temperatures at or below 150° C. since temperatures above 150° C. will cause damage to the structure of a Josephson Junction Phase Quantum Bit. In an aspect of the invention, the superconductor material layer is aluminum and the photoresist developer contains sodium hydroxide (NaOH) that can cause etching of the aluminum (Al). In yet a further aspect of the invention, the organic spin-on material is an organic anti-reflective coating. In yet another aspect of the invention, the protective barrier layer is a photosensitive material and is cured by employing a photocuring process (e.g., exposure to ultraviolet light (UV)).

Figure 1:
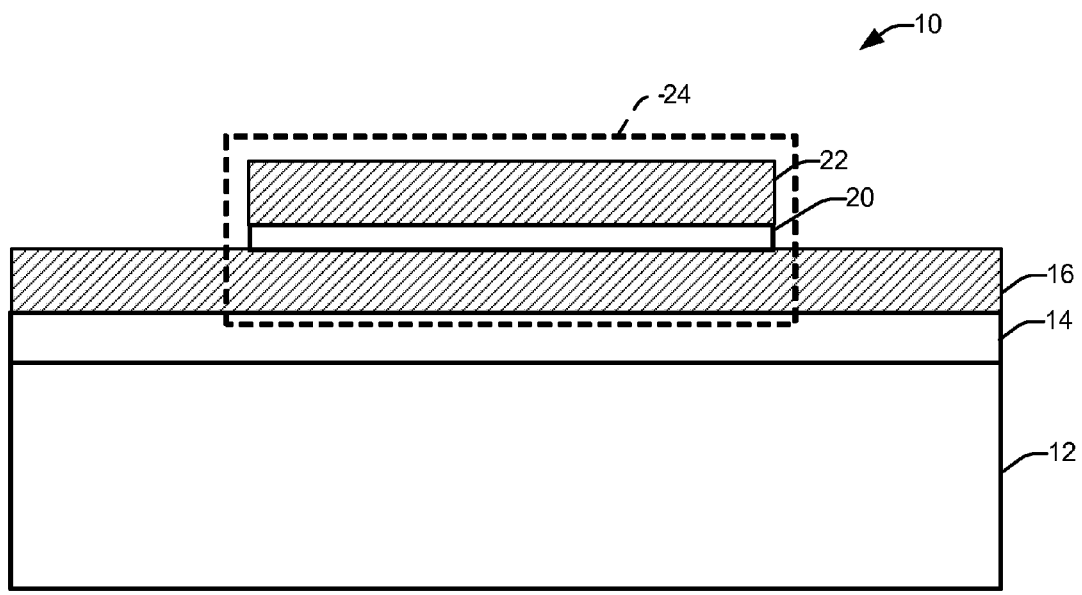
FIG. 1 illustrates a schematic cross-sectional view of a Josephson junction (JJ) phase quantum bit (qubit) in accordance with an aspect of the present invention.

FIG. 1 illustrates cross-sectional view of a Josephson junction (JJ) phase quantum bit (qubit) 10 in accordance with an aspect of the present invention. The JJ phase qubit 10 comprises a JJ 24 residing over an insulator layer 14 that resides over a substrate 12. The JJ is formed of a dielectric layer 20 sandwiched between a superconductor base layer portion 16 and a superconductor mesa layer portion 22 aligned with one another. The substrate 12 can be formed of silicon or another substrate material and the insulator layer 14 can be formed of an oxide or other insulator material. Alternatively, the substrate 12 can be formed of an insulated substrate, such that the insulating layer 14 can be omitted during fabrication of the JJ phase qubit 10. Formation of the JJ phase qubit 10 requires a series of precise metal and metal-and-insulator etch steps guided by lithography to pattern the comprising films into the requisite device structures.

The present invention utilizes standard silicon processing equipment and techniques with in the production of JJ phase qubits significantly reducing plant cost of manufacturing JJ phase qubits. Unlike standard silicon photolithography and etching, which can utilize processing temperatures exceeding 200° C. to stabilize photoresist and enhance reactive etching catalysis, JJ phase qubit processing requires processing temperatures below 150° C. due to the fragile structure of the JJ's ultra-thin tunnel insulator. Furthermore, due to the sensitivity of JJ phase qubits to chemical impurities, care must be taken to protect the metal from unintentional corruption.

Photolithography is repeated for each masking layer in the formation of the JJ phase quibit. Because the photoresist developers utilized in silicon processing can contain materials (e.g., sodium hydroxide (NaOH)) that etch superconductors (e.g., Al), a protective barrier layer is deposited over the superconductor layer before deposition of photoresist. The protective barrier layer protects the JJ qubit structure from unintentional etching, but is cleared easily in a dry etch process prior to superconductor etch. This disclosure presents the method for using a buffer film for the processing of this temperature-sensitive and chemical-sensitive process.

Figure 2:
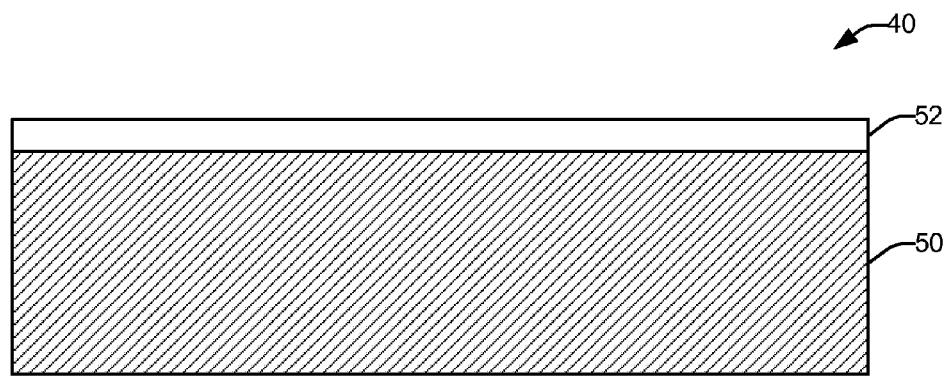
FIG. 2 illustrates a schematic cross-sectional view of a superconductor structure in its early stages of fabrication in accordance with an aspect of the present invention.

Turning now to FIGS. 2-10, fabrication is discussed in connection with formation of openings in the superconductor layers to form superconductor raised portions of the JJ phase qubit of FIG. 1. It is to be appreciated that the present example is discussed with respect to a JJ phase qubit, however, the methodology can be employed for forming a variety of different superconductor devices in addition to other superconducting circuitry employing a patterned superconductor material layer. FIG. 2 illustrates a superconductor structure in its early stages of fabrication. The superconductor structure 40 includes a superconductor material layer 50 comprising, for example, aluminum, niobium, or some other superconductor material. The superconductor material layer 50 will reside on another layer (not shown), for example, an insulator layer, a dielectric layer or an insulated substrate that provides mechanical support for the superconductor material layer 50.

A protective barrier layer 52 is formed over the superconductor material layer 50 and protects the superconductor material layer 50 from a photoresist developer utilized during the formation of an etch mask to etch openings to form patterns in the superconductor material layer 50. Any suitable technique for forming the protective barrier layer 52 may be employed such as Low Pressure Chemical Vapor Deposition (LPCVD), Plasma Enhanced Chemical Vapor Deposition (PECVD), Atomic Layer Deposition (ALD), sputtering or spin on techniques to a thickness suitable for providing protection of the underlying superconductor material layer 50. The protective barrier layer 52 can have a thickness, for example, of about 600 Å to about 800 Å (e.g., 700 Å).

Figure 3:
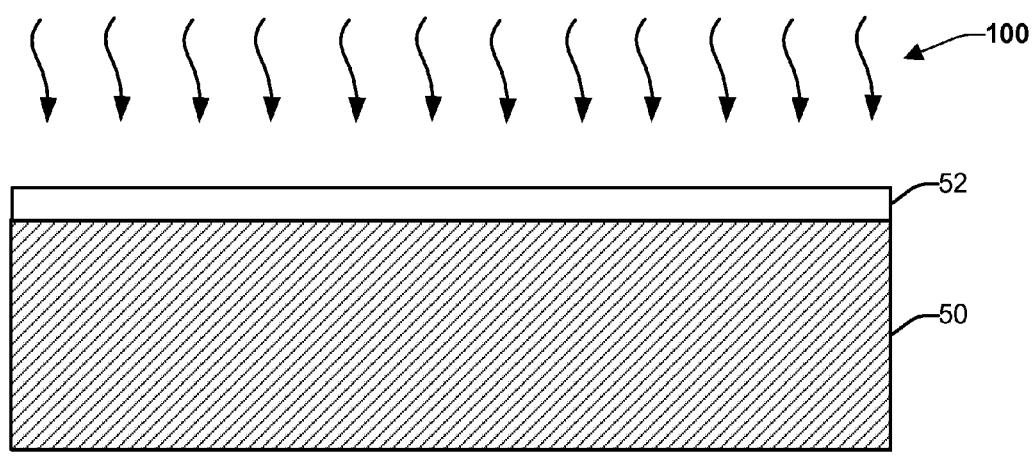
FIG. 3 illustrates a schematic cross-sectional view of the structure of FIG. 2 undergoing a high temperature baking process in accordance with an aspect of the present invention.

In one aspect of the invention, the protective barrier layer 52 can be formed of an organic spin-on material (e.g., an organic anti-reflective coating) that can be cured at temperatures at or below 150° C. since temperatures above 150° C. will cause damage to the structure of a JJ phase Qubit. In an aspect of the invention, the organic spin-on material is a material referred to as i-CON-7™ purchased from Brewer Science that includes a recommendation to cure the organic spin-on material at a temperature of 180° C. for 60 seconds. However, it has been determined as illustrated in FIG. 3, that this material can be cured by a high temperature baking process 100 at temperatures between about 140° C. to about 150° C. (e.g., about 145° C.) for about 60 seconds to about 120 seconds (e.g., about 90 seconds), which will not harm the JJ phase qubit but still provide adequate curing of the protective barrier layer 52. Alternatively, the protective barrier layer 52 is a photosensitive material and is cured by employing a photocuring process (e.g., exposure to ultraviolet light (UV)).

Figure 4:
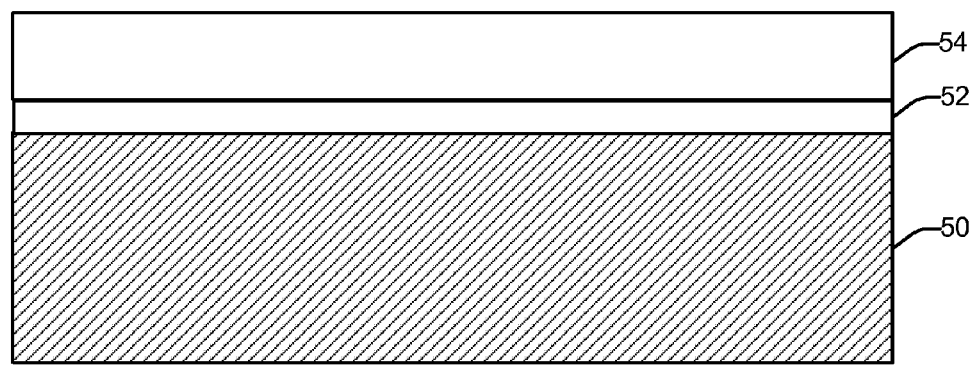
FIG. 4 illustrates a schematic cross-sectional view of the structure of FIG. 3 after a photoresist material layer has been deposited in accordance with an aspect of the present invention.
Figure 5:
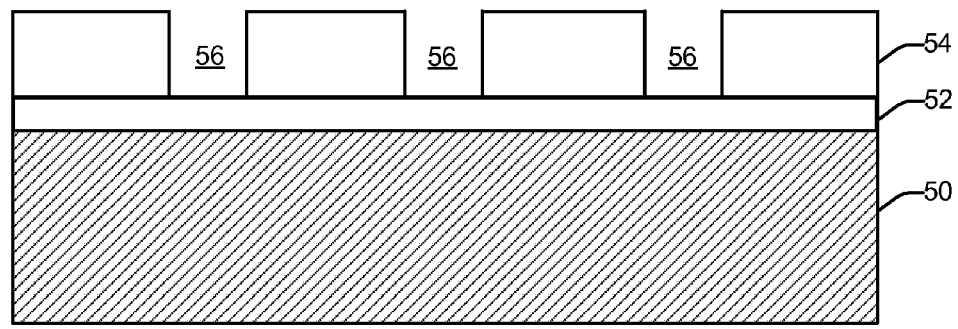
FIG. 5 illustrates a schematic cross-sectional view of the structure of FIG. 4 after the photoresist material layer has been patterned in accordance with an aspect of the present invention.

Next, as represented in FIG. 4, a photoresist material layer 54 is applied to cover the structure and is then patterned and developed to expose open regions 56 (FIG. 5) in the photoresist material layer 54 in accordance with an opening pattern. The photoresist material layer 54 can have a thickness that varies in correspondence with the wavelength of radiation used to pattern the photoresist material layer 54. The photoresist material layer 54 may be formed over the protective barrier layer 52 via spin-coating or spin casting deposition techniques, selectively irradiated and developed to form the openings 56. The developer utilized in the developing of the photoresist has no effect on the protective barrier layer 52.

Figure 6:
FIG. 6 illustrates a schematic cross-sectional view of the structure of FIG. 5 undergoing an etch step to extend openings in a protective barrier layer in accordance with an aspect of the present invention.
Figure 6:
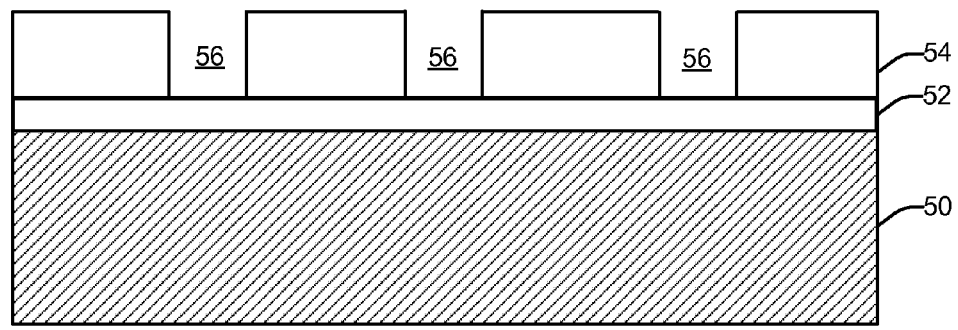
Figure 7:
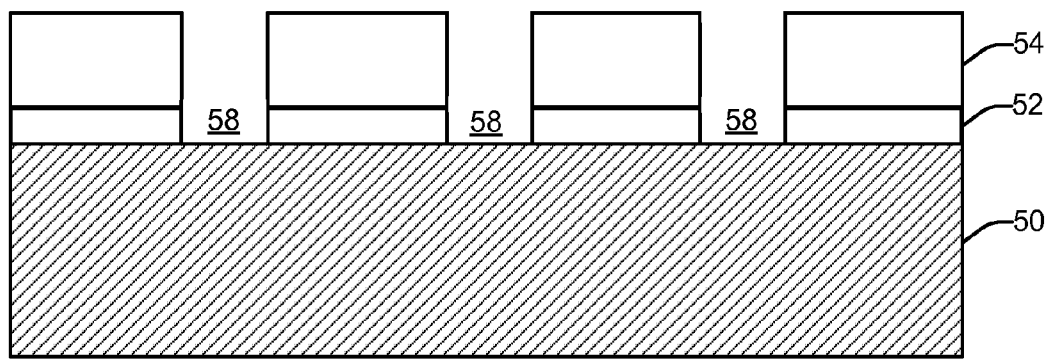
FIG. 7 illustrates a schematic cross-sectional view of the structure of FIG. 6 after the etch step to extend openings in the protective barrier layer in accordance with an aspect of the present invention.

FIG. 6 illustrates performing of an etch 110 (e.g., anisotropic reactive ion etching (RIE)) on the protective barrier layer 52 to form extended openings 58 (FIG. 7) in the protective barrier layer 52 based on the opening pattern in the photoresist material layer 54. The etch step 110 can be a dry etch or wet etch that employs an etchant which selectively etches the protective barrier layer 52 at a faster rate than the underlying superconducting material layer 50 and the overlying photoresist material layer 54. For example, the protective barrier layer 52 may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 54 to thereby create the extended openings 58.

Figure 8:
FIG. 8 illustrates a schematic cross-sectional view of the structure of FIG. 7 undergoing an etch step to extend openings in a superconductor material layer in accordance with an aspect of the present invention.
Figure 8:
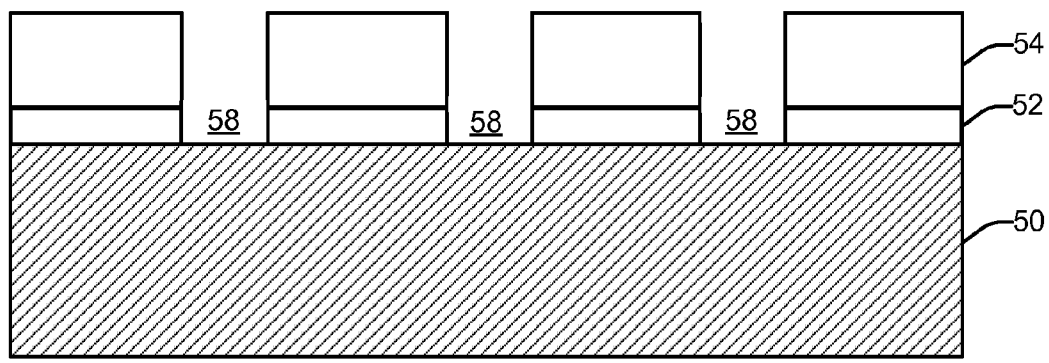
Figure 9:
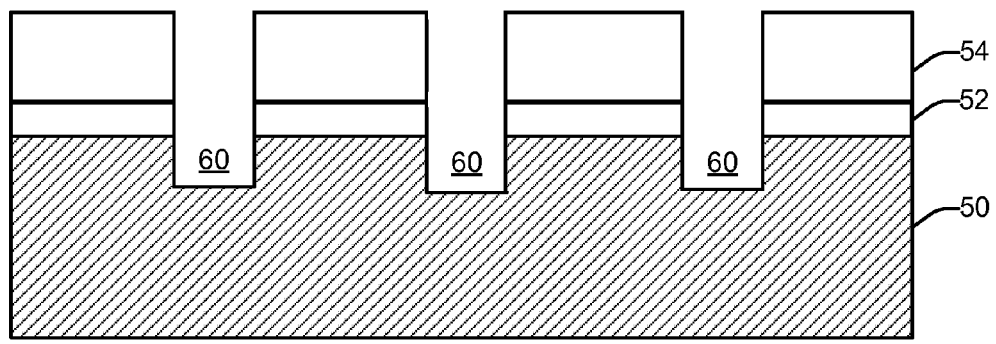
FIG. 9 illustrates a schematic cross-sectional view of the structure of FIG. 8 after the etch step to extend openings in the superconductor material layer in accordance with an aspect of the present invention.
Figure 10:
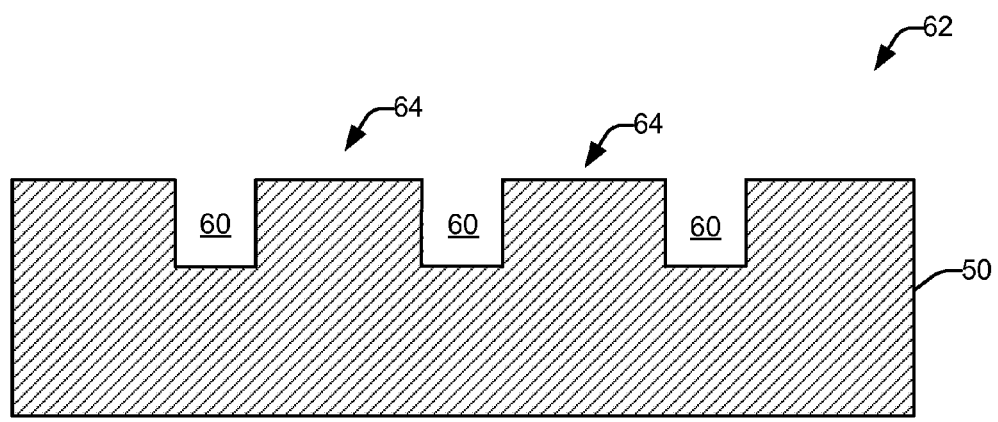
FIG. 10 illustrates a schematic cross-sectional view of the structure of FIG. 9 after undergoing a strip of the photoresist material layer and the protective barrier layer in accordance with an aspect of the present invention.

FIG. 8 illustrates performing of an etch step 120 on the superconductor material layer 50 to form extended openings 60 (FIG. 9) in the superconductor material layer 50. The etch 120 can be, for example, a dry chlorine based plasma etch. For example, the superconductor material layer 50 can be anisotropically etched with a plasma gas(es) containing chlorine ions, in a commercially available etcher, such as a parallel plate Reactive Ion Etch (RIE) apparatus, Inductively Coupled Plasma (ICP) reactor or, alternatively, an electron cyclotron resonance (ECR) plasma reactor to replicate the mask pattern of the patterned photoresist material layer 54 to thereby create the opening pattern in the superconductor material layer 50. Alternatively, the etch 120 may be a wet etch. Preferably, a selective etch technique is used to etch the superconductor material layer 50 at a relatively greater rate as compared to the patterned photoresist material layer and underlying layer (not shown). The photoresist material layer 54 and the protective barrier layer 52 are thereafter stripped (e.g., ashing in an $O_2$ plasma) so as to result in the structure shown in FIG. 10, which illustrates a set of superconductor material raised portions 64 that can be employed in either of the base layer or the mesa layer of a superconductor device.

For example, the methodology described in FIGS. 2-10 can be employed to create a base layer opening pattern that includes a first set of superconductor material raised portions. The base layer opening pattern can be formed over an insulator layer that has been deposited over a substrate or over an insulated substrate. The superconductor material layer 50 can be deposited over the insulator layer or insulated substrate. The methodology described in FIGS. 2-10 can be repeated to form a mesa layer opening pattern that includes a second set of superconductor material raised portions that can be aligned with the first set of superconductor material raised portions and further comprising forming a dielectric layer between each respective aligned superconductor material raised portion to form a plurality of Josephson junctions. Alternatively, a tri-layer of metal-dielectric-metal layer can be deposited with the fabrication of the mesa layer contacts being illustrated in FIGS. 2-10 with the etch 120 comprising one or more etch steps that etches an extended opening through the tri-layer.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor circuit, the method comprising:
    depositing a protective barrier layer over a superconducting material layer;
    curing the protective barrier layer;
    depositing a photoresist material layer over the protective barrier layer;
    irradiating and developing the photoresist material layer to form an opening pattern in the photoresist material layer;
    etching the protective barrier layer to form openings in the protective barrier layer based on the opening pattern;
    etching the superconductor material layer based on the openings in the protective barrier layer to form openings in the superconductor material layer that define a first set superconductor material raised portions;
    stripping the photoresist material layer and the protective barrier layer; and
    wherein the superconducting material layer is a first superconducting material layer that overlies a dielectric layer overlying a second superconducting material layer that together form a tri-layer.

2. The method of claim 1, wherein the curing the protective barrier layer comprises photorcuring the protective barrier layer.

3. The method of claim 1, wherein the protective barrier layer is cured at a temperature of about 140° C. to about 150° C. for about 60 to about 120 seconds.

4. The method of claim 1, wherein the protective barrier layer is a spin-on organic material.

5. The method of claim 1, wherein the protective barrier layer is an anti-reflective coating.

6. The method of claim 1, wherein the superconductive material layer is aluminum and developer utilized to develop the photoresist material layer contains sodium hydroxide, such that the protective barrier layer protects the aluminum from the sodium hydroxide during developing of the photoresist material layer.

7. The method of claim 1, further comprising etching the dielectric layer and etching the second superconducting material layer of the tri-layer prior to the stripping of the protective barrier layer.

8. A method of forming a superconductor circuit, the method comprising:
    depositing a protective barrier layer over a superconducting material layer;
    curing the protective barrier layer;
    depositing a photoresist material layer over the protective barrier layer;
    irradiating and developing the photoresist material layer to form an opening pattern in the photoresist material layer;
    etching the protective barrier layer to form openings in the protective barrier layer based on the opening pattern;
    etching the superconductor material layer based on the openings in the protective barrier layer to form openings in the superconductor material layer that define a first set superconductor material raised portions;
    stripping the photoresist material layer and the protective barrier layer; and
    repeating the steps as recited above to form a second set of superconductor material raised portions that align with respective raised portions of the first set of superconductor material raised portions and a dielectric layer is formed between each aligned raised portion of the first and second sets of superconductor raised portions to form a plurality of Josephson junctions.

9. A method for forming Josephson junctions, the method comprising:
    depositing a protective barrier layer formed of an organic spin-on material over a superconducting material layer;
    curing the protective barrier layer at a temperature of about 140° C. to about 150° C. for about 60 to about 120 seconds;
    depositing a photoresist material layer over the protective barrier layer;
    irradiating and developing the photoresist material layer to form an opening pattern in the photoresist material layer;

etching the protective barrier layer to form openings in the protective barrier layer based on the opening pattern;

etching the superconductor material layer based on the openings in the protective barrier layer to form openings in the superconductor material layer that define a first set superconductor material raised portions for the Josephson junctions; and stripping the photoresist material layer and the protective barrier layer.

10. The method of claim 9, wherein the superconductive material layer is aluminum and developer utilized to develop the photoresist material layer contains sodium hydroxide, such that the protective barrier layer protects the aluminum from the sodium hydroxide during developing of the photoresist material layer.

11. The method of claim 9, wherein the protective barrier layer is photosensitive coating and the curing the protective barrier layer comprises photocuring the protective barrier layer.

12. The method of claim 11, wherein the curing the protective barrier layer comprises curing the protective barrier layer at a temperature of about 145° C. for about 90 seconds.

13. The method of claim 9, wherein the method of claim 9 is repeated to form a second set of superconductor material raised portions that align with respective raised portions of the first set of superconductor material raised portions and further comprising forming a dielectric layer between each aligned raised portion of the first and second set of superconductor material raised portions to form a plurality of Josephson junctions.

14. The method of claim 13, wherein the plurality of Josephson junction are formed on an insulator layer, a dielectric layer or an insulated substrate.

15. A method for forming a Josephson junction, the method comprising:

depositing a superconductor material layer over an insulator layer and/or insulated substrate;

depositing a protective barrier layer over the superconducting material layer;

curing the protective barrier layer, wherein the curing the protective barrier layer comprises curing the protective barrier layer at a temperature of about 145° C. for about 90 seconds;

depositing a photoresist material layer over the protective barrier layer;

irradiating and developing the photoresist material layer to form an opening pattern in the photoresist material layer;

etching the protective barrier layer to form openings in the protective barrier layer based on the via pattern;

etching the superconductor material layer based on the openings in the protective barrier layer to form openings in the superconductor material layer that define a base layer raised portion of the Josephson junction; and stripping the photoresist material layer and the protective barrier layer.

16. The method of claim 15, wherein the superconductive material layer is aluminum and developer utilized to develop the photoresist material layer contains sodium hydroxide, such that the protective barrier layer protects the aluminum from the sodium hydroxide during developing of the photoresist material layer.

17. The method of claim 15, wherein the method of claim 16 is repeated to form a mesa layer raised portion aligned with the base layer raised portion of the Josephson junction and further comprising forming a dielectric layer between the base layer raised portion and mesa layer raised portion.

18. The method of claim 15, wherein the curing the protective barrier layer comprises photocuring the protective barrier layer.

* * * * *